(12) United States Patent
Middleton (10) Patent No.: US 9,691,984 B2
(45) Date of Patent: Jun. 27, 2017

(54) SEMICONDUCTING POLYMER AND ORGANIC ELECTROLUMINESCENCE DEVICE THEREOF

(75) Inventor: Helen Middleton, Beeston (GB)

(73) Assignees: CAMBRIDGE DISPLAY TECHNOLOGY LIMITED, Cambridgeshire (GB); SUMITOMO CHEMICAL COMPANY LIMITED, Tokyo (JP)

( * ) Notice: Subject to any disclaimer, the term of this patent is extended or adjusted under 35 U.S.C. 154(b) by 905 days.

(21) Appl. No.: 13/979,644

(22) PCT Filed: Jan. 11, 2012

(86) PCT No.: PCT/GB2012/000019
§ 371 (c)(1),
(2), (4) Date: Aug. 6, 2013

(87) PCT Pub. No.: WO2012/095629
PCT Pub. Date: Jul. 19, 2012

(65) Prior Publication Data
US 2013/0306950 A1 Nov. 21, 2013

(30) Foreign Application Priority Data
Jan. 12, 2011 (GB) .................. 1100486.8

(51) Int. Cl.
| H01L 51/54 | (2006.01) |
| C09K 11/06 | (2006.01) |
| H01L 51/00 | (2006.01) |
| C08G 61/10 | (2006.01) |
| H01L 51/50 | (2006.01) |

(52) U.S. Cl.
CPC ...... *H01L 51/0035* (2013.01); *H01L 51/0039* (2013.01); *C08G 61/10* (2013.01); *C08G 2261/1424* (2013.01); *H01L 51/5016* (2013.01); *H01L 51/5048* (2013.01)

(58) Field of Classification Search
CPC ........ C08G 61/00; C08G 61/02; C08G 61/10; C08G 61/12; C08G 2261/00; C08G 2261/11; C08G 2261/12; C08G 2261/14; C08G 2261/142; C08G 2261/1424; C09K 2211/00; C09K 2211/14; C09K 2211/108; C09K 2211/1016; C09K 2211/1425; C09K 11/06; H01L 51/0032; H01L 51/0034; H01L 51/0035; H01L 51/0039; H01L 51/50; H01L 51/5012; H01L 51/5016; H01L 51/5048; H01L 51/5056; H01L 51/5072
USPC ....... 428/690, 691, 917, 411.4, 336; 427/58, 427/66; 313/500–512; 257/40, 88–104, 257/E51.001–E51.052; 252/301.16–301.35, 500; 528/8, 166; 438/99
See application file for complete search history.

(56) References Cited

U.S. PATENT DOCUMENTS

| 5,621,131 | A | 4/1997 | Kreuder et al. |
| 5,723,873 | A | 3/1998 | Yang |
| 5,798,170 | A | 8/1998 | Zhang et al. |
| 6,353,083 | B1 | 3/2002 | Inbasekaran et al. |
| 2010/0025703 | A1* | 2/2010 | Towns .................. C08L 65/00 257/98 |
| 2010/0327735 | A1 | 12/2010 | Cella et al. |
| 2011/0006294 | A1* | 1/2011 | Tanaka .................. C08G 61/02 257/40 |

FOREIGN PATENT DOCUMENTS

| EP | 0 707 020 A2 | 4/1996 |
| EP | 0 842 208 A1 | 5/1998 |
| EP | 0 901 176 A2 | 3/1999 |
| EP | 0 947 123 A1 | 10/1999 |
| EP | 2 249 411 A1 | 11/2010 |
| GB | 2 348 316 A | 9/2000 |
| JP | WO 2009110642 A1 * | 9/2009 ............ C08G 61/02 |
| WO | WO-98/10621 A1 | 3/1998 |

(Continued)

OTHER PUBLICATIONS

Bernius et al., "Progress with Light-Emitting Polymers," *Adv. Mat.*, 12(23):1737-1750 (2000).

(Continued)

*Primary Examiner* — Andrew K Bohaty
(74) *Attorney, Agent, or Firm* — Marshall, Gerstein & Borun LLP (57) ABSTRACT

A semiconducting polymer and electronic devices comprising such polymer, in which the polymer has one or more repeat units, a first of the repeat units having the structure

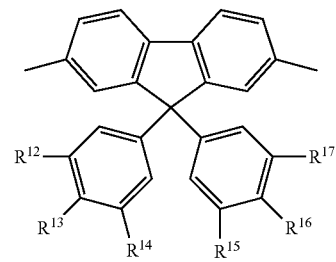

wherein $R^{12}$ to $R^{17}$ independently comprise H or a polyether group having at least five ethoxy repeat units, and in which at least one of $R^{12}$ to $R^{17}$ has a polyether group.

24 Claims, 5 Drawing Sheets

(56) References Cited

FOREIGN PATENT DOCUMENTS

| WO | WO-98/57381 A1 | 12/1998 |
|---|---|---|
| WO | WO-99/48160 A1 | 9/1999 |
| WO | WO-00/48258 A1 | 8/2000 |
| WO | WO-00/53656 A1 | 9/2000 |
| WO | WO-00/55927 A1 | 9/2000 |
| WO | WO-01/62869 A1 | 8/2001 |
| WO | WO-02/084759 A1 | 10/2002 |
| WO | WO-2010/065178 A1 | 6/2010 |

OTHER PUBLICATIONS

Chen et al., "P-223: Enhanced Power Efficiency of Single-Layer White Triplet Polymer Light-Emitting Diodes by Blending with Polymer Oxides," *SID Symposium Digest of Technical Papers*, 39(1):2043-2045 (2008).

Lindgren et al., "Synthesis and Properties of Polyfluorenes with Phenyl Substituents," *Synth. Metals*, 154(1-3):97-1000 (2005).

Niu et al., "Thermal Annealing Below the Glass Transition Temperature: A General Way to Increase Performance of Light-Emitting Diodes Based on Copolyfluorenes," *Appl. Phys. Lett.*, 81(4):634-636 (2002).

Setayesh et al., "Bridging the Gap Between Polyfluorene and Ladder-Poly-p-phenylene: Synthesis and Characterization of Poly-2,8-indenofluorene," *Macromolecules*, 33(6):2016-2020 (2000).

Yamaguchi et al., "Effects of B and C on the Ordering of $L1_0$—CoPt Thin Films," *Appl. Phys. Lett.*, 79(5):2001-2003 (2001).

Yamamoto, "Electrically Conducting and Thermally Stable $\pi$-Conjugated Poly(Arylene)s Prepared by Organometallic Processes," *Prog. Polym. Sci.*, 17:1153-1205 (1993).

Yang et al., "Efficient blue polymer light-emitting diodes from a series of soluble poly(paraphenylene)s", *J. Appl. Phys.*, 79(2):934-939 (1996).

Combined Search and Examination Report for Application No. GB1100486.8, dated May 12, 2011.

International Search Report and Written Opinion for Application No. PCT/GB2012/000019, dated May 4, 2012.

International Preliminary Report on Patentability for Application No. PCT/GB2012/000019, dated Jul. 16, 2013.

\* cited by examiner

SEMICONDUCTING POLYMER AND ORGANIC ELECTROLUMINESCENCE DEVICE THEREOF

The present invention relates to electroluminescence and to organic electroluminescent materials for optical devices and the control of their physical properties.

Opto-electronic devices such as organic photovoltaics (OPV) and organic light emitting diodes (OLEDs) are usually formed as functional layers sandwiched between an anode layer, often made from indium tin oxide (ITO) on a glass or polymer substrate, and a low work-function cathode layer such as aluminium/lithium fluoride.

The functional layers usually include an electroluminescent layer or a photoactive layer and may also include a hole transport layer and/or an electron transport layer. In these devices, charge carriers (electrons or holes) are transported to or from the electroluminescent or photoactive layer through the hole or electron transport layer from the anode or cathode respectively. More specifically, charge carriers injected into an electroluminescent layer or generated by a photoactive layer will travel to or from the interface between that layer and the hole or electron transport layer, from or towards the relevant electrode at the other surface of the relevant charge transport layer.

It is generally desirable to reduce the operating voltage of an OLED. Electronic devices with small molecular emitters, e.g. bis-[4,6-difluoro-phenyl]-pyridinato-N,$C^2$] (picolinate) iridium(III) and [2-(2'-benzothienylpyridinato-N,$C^3$] (acetylacetonate) iridium(III), have been fabricated simply by mixing polyethylene glycol into the emission layer (see for example Chen et al. SID 08 Digest 2008 pp 2043 to 2045). While certain performance improvements, such as a reduction in operating voltage, appear to be garnered from the use of such mixes, the devices themselves can be difficult to manufacture successfully, as these mixes are not always homogeneous, as the emitting molecules and polyethylene glycol tends to phase separate.

It is an object of the present invention to provide devices and materials and methods for the manufacture of those devices where improvements in performance are accompanied by relative ease of manufacture.

In a first aspect, the invention provides a semiconducting polymer having one or more repeat units, a first of the repeat units comprising the structure wherein $R^{12}$ to $R^{17}$ independently comprise H or a polyether group having at least five, preferably five to fifteen, ethoxy or higher ether repeat units, where at least one of $R^{12}$ to $R^{17}$ does not comprise H.

In another aspect, the invention provides a semiconducting polymer having one or more repeat units, a first of the repeat units comprising the structure wherein $R^{12}$ to $R^{17}$ independently comprise H or a polyether group having at least four ether ethoxy or higher repeat units, where at least one of $R^{12}$ to $R^{14}$ and/or at least one of $R^{15}$ to $R^{17}$ do not comprise H and preferably where at least one (e.g. two) of $R^{12}$ to $R^{14}$ and/or at least one (e.g. two) of $R^{15}$ to $R^{17}$ do not comprise a polyether group.

In another aspect, the invention provides a semiconducting polymer having one or more repeat units, at least some of the repeat units being substituted with a polyether group.

Preferably the polyether group comprises at least four (e.g. 5 to 15, 5 to 10, for example 7 to 8) ether repeat units.

In some embodiments, the average length of the polyether substituents is at least four (e.g. 5 to 15, 5 to 10, for example 7 to 8) ether repeat units.

The inventors have found a surprising improvement in conductivity from such polymers.

Moreover, the inventors have also found that such polymers can be used to create e.g. a light emitting layer which has orthogonal solubility to an adjacent semiconducting layer not substituted by a polyether group when in an electronic device. This prevents quenching at the layer interface and allows adjacent layers to be deposited using different solvents, thereby reducing the potential for a deposited layer to be partially dissolved or otherwise damaged by the deposition of an adjacent layer.

Furthermore, it is believed that the substitution of semiconducting polymers with polyether groups allows for a control of viscosity of solutions of those polymers, e.g. if a higher proportion of repeat units is substituted then a higher viscosity solution is provided. This would allow the user to optimise solution viscosity for a given deposition technique during device manufacture.

It is a further advantage to provide polyethers and semiconducting polymers as a single component material.

Preferably at least 0.01%, e.g. 1%, of the repeat units is substituted with at least one polyether group. In some preferred embodiments, at least 5%, e.g. 10%, 15%, 20%, 25%, 30%, 35%, 40%, 45%, 50%, 55%, 60%, 65% or 70% of the repeat units of the polymer is substituted with at least one, e.g. two, polyether groups.

Preferably, the polyether groups comprise optionally substituted polyethylene glycol groups.

In some embodiments, the polyether groups may be substituted, e.g. by $C_1$ to $C_5$ straight, branched or cyclic alkyl, aklenyl or alkynyl carbon chains.

In some embodiments, the polymer comprises second repeat units comprising one or more diether substituents.

Preferably, the polymer comprises fluorene repeat units.

Preferably, at least a portion of the fluorene repeat units comprise the structure:

where $R^{10}$ and $R^{11}$ independently comprise H or a polyether group and/or an optionally substituted straight branched or cyclic $C_1$ to $C_2$ alkyl, alkenyl or alkynyl chain.

In certain embodiments at least a portion of the fluorene repeat units comprise a structure:

wherein $R^{12}$ to $R^{17}$ independently comprise H or a polyether group, where at least one of $R^{12}$ to $R^{17}$ does not comprise H.

In some preferred embodiments, $R^{12}$, $R^{14}$, $R^{15}$ and $R^{17}$ comprise H and $R^{13}$ and/or $R^{16}$ comprise a polyether group.

In other preferred embodiments, $R^{13}$ and $R^{16}$ comprise H and $R^{12}$ and/or $R^{14}$ and/or $R^{15}$ and/or $R^{17}$ comprise a polyether group.

In other preferred embodiments, at least four, e.g. all, of $R^{12}$ to $R^{17}$ comprise polyether groups.

Preferably, the polyether groups are terminated by terminating groups such as optionally substituted straight, branched or cyclic $C_1$ to $C_{10}$, e.g. $C_1$ to $C_5$, alkyl, alkenyl or alkynyl carbon chains. For example, in some embodiments the polyether groups are terminated by terminating groups comprising methyl or ethyl groups.

In some embodiments the polymer includes repeat units comprising hole transport moieties (e.g. triaryl amine groups and the like, as shown in formulae 1 to 3 and 7 to 21) where some or all of the hole transport moieties are substituted with a polyether group.

In some embodiments, the polymer further comprises one or more phosphorescent species.

In a further aspect, the invention provides an electroluminescent material comprising a semiconducting polymer as described above.

In a further aspect, the invention provides a composition comprising a semiconducting polymer as described above and a polyether compound, e.g. polyethylene glycol.

In a further aspect the invention provides a hole transport medium comprising a semiconducting polymer as described above.

In a further aspect, the invention provides an electronic transport medium comprising a semiconducting polymer as described above.

In a further aspect, the invention provides an electronic device comprising a semiconducting polymer as described above.

In a further aspect, the invention provides a light emitting device comprising a light emitting layer comprising a semiconducting polymer as described above.

In some embodiments, the light emitting device comprises a hole transport layer and/or an electron transport layer adjacent the light emitting layer, where one or both of the hole transport and electron transport layers, if present, does not comprise a polyether substituted material.

In a further aspect, the invention provides an electronic device comprising a hole transport layer comprising semiconducting polymer as described above.

In a further aspect, the invention provides a light emitting device comprising a light emitting layer comprising a light-emitting polymer and/or a hole transport material and/or an electron transport material as described above.

In a further aspect, the invention provides an electronic device comprising an electron transport layer comprising a semiconducting polymer as described above.

Preferably, the electronic transport layer further comprises a polyether compound, e.g. polyethylene glycol.

Preferably the hole transport layer further comprises a polyether compound, e.g. polyethylene glycol.

Preferably, the light emitting layer further comprises a polyether compound, e.g. polyethylene glycol.

Preferably the light emitting layer further comprises a phosphorescent species.

In a further aspect, the invention provides a method for manufacturing an electronic device comprising applying a solution comprising a semiconducting polymer as described above to a substrate.

Preferably, the solution is applied by e.g. printing or spin coating.

In order that the invention may be better understood, it is described below with reference to the accompanying drawings.

Figure 1:
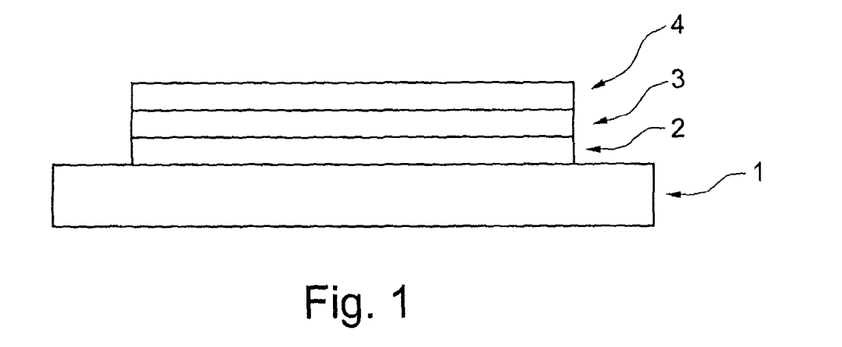
FIG. 1 shows a schematic diagram of an optical device.

With reference to FIG. 1, the architecture of an electroluminescent device according to the invention comprises a transparent glass or plastic substrate 1, an anode 2 of indium tin oxide and a cathode 4. An electroluminescent layer 3 is provided between anode 2 and cathode 4.

In a practical device, at least one of the electrodes is semi-transparent in order that light may be absorbed (in the case of a photoresponsive device) or emitted (in the case of an OLED). Where the anode is transparent, it typically comprises indium tin oxide.

Further layers may be located between anode 2 and cathode 3, such as charge transporting, charge injecting or charge blocking layers.

In particular, it is desirable to provide a conductive hole injection layer formed of a doped organic material located between the anode 2 and the electroluminescent layer 3 to assist hole injection from the anode into the layer or layers of semiconducting polymer. Examples of doped organic hole injection materials include poly(ethylene dioxythiophene) (PEDT), polyaniline as disclosed in U.S. Pat. No. 5,723,873 and U.S. Pat. No. 5,798,170, and poly(thienothiophene). Exemplary acids include PEDT doped with polystyrene sulfonate (PSS) as disclosed in EP 0901176 and EP 0947123, polyacrylic acid or a fluorinated sulfonic acid, for example Nafion®.

If present, a hole transporting layer located between anode 2 and electroluminescent layer 3 preferably has a HOMO level of less than or equal to 5.5 eV, more preferably around 4.8-5.5 eV.

If present, an electron transporting layer located between electroluminescent layer 3 and cathode 4 preferably has a LUMO level of around 1.8-2.6 eV.

Electroluminescent layer 3 may consist of the electroluminescent material alone or may comprise the electroluminescent material in combination with one or more further materials. In particular, the electroluminescent material may be blended with hole and/or electron transporting materials as disclosed in, for example, WO 99/48160, or may comprise a luminescent dopant in a semiconducting host matrix. Alternatively, the electroluminescent material may be covalently bound to a charge transporting material and/or host material.

Electroluminescent layer 3 may be patterned or unpatterned. A device comprising an unpatterned layer may be used an illumination source, for example. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of a low workfunction material and a high workfunction material such as calcium and aluminium as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example lithium fluoride as disclosed in WO 00/48258 or barium fluoride as disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Suitable electroluminescent and/or charge transporting polymers include poly(arylene vinylenes) such as poly(p-phenylene vinylenes) and polyarylenes.

Polymers preferably comprise a first repeat unit selected from arylene repeat units as disclosed in, for example, Adv. Mater. 2000 12(23) 1737-1750 and references therein. Exemplary first repeat units include: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorene, nitro or cyano; and substituents for increasing glass transition temperature (Tg) of the polymer.

Particularly preferred polymers comprise optionally substituted, 2,7-linked fluorenes, most preferably repeat units of formula VIII:

(VIII)

wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

A polymer comprising the first repeat unit may provide one or more of the functions of hole transport, electron transport and emission depending on which layer of the device it is used in and the nature of co-repeat units.

In Particular:

a copolymer comprising a first repeat unit and a triarylamine repeat unit, in particular a repeat unit of formula (IX):

(IX)

wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 1 may be substituted. Preferred substituents include alkyl and alkoxy groups. Any of the aryl or heteroaryl groups in the repeat unit of Formula 1 may be be linked by a direct bond or a divalent linking atom or group. Preferred divalent linking atoms and groups include O, S; substituted N; and substituted C.

Particularly preferred units satisfying Formula (IX) include units of Formulae 1-3:

1

2

3 wherein Ar¹ and Ar² are as defined above; and Ar³ is optionally substituted aryl or heteroaryl. Where present, preferred substituents for Ar³ include alkyl and alkoxy groups.

a copolymer comprising a first repeat unit and heteroarylene repeat unit may be utilised for charge transport or emission. Preferred heteroarylene repeat units are selected from formulae 7-21:

7 wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

8

9

10

11

12

13

16

17

18

-continued

19

20

21

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

A dibromo monomer unit (monomer 1) comprising polymeric ethylene oxide side chains in which n is three or greater was synthesised as follows:

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

Preferred methods for preparation of these polymers are Suzuki polymerisation as described in, for example, WO 00/53656 and Yamamoto polymerisation as described in, for example, T. Yamamoto, "Electrically Conducting And Thermally Stable—Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Other monomer units are:

Monomer 9
2,7-dipinacolborane-9,9-dioctylfluorene

-continued

Monomer 11

COMPARATIVE EXAMPLE 1

A semiconducting polymer 100 comprising 50% monomer 2a, 34.8% monomer 2b, 15% monomer 3, 0.1% monomer 4 and 0.1% monomer 5 was prepared by Suzuki polymerisation for use as a control.

EXAMPLE 1

A semiconducting polymer 101 according to a first embodiment of the invention was prepared by Suzuki polymerisation, the polymer 101 comprising 15% monomer 1, 50% monomer 2a, 19.9% monomer 2b, 15% monomer 3 and 0.1% monomer 5.

EXAMPLE 2

A semiconducting polymer 102 according to a second embodiment of the invention was prepared by Suzuki polymerisation, the polymer 102 comprising 34.8% monomer 1, 50% monomer 2a, 15% monomer 3, 0.1% monomer 4 and 0.1% monomer 5.

Polymer 100 was not soluble in DMSO at room temperature and showed only partial solubility upon heating. Polymer 101 showed partial solubility in DMSO at room temperature and was readily soluble when heated. Polymer 102 was readily soluble in DMSO at room temperature. A further example polymer comprising 50% monomer 1 and 50% monomer 2a was also readily soluble in DMSO at room temperature. Thus, it was demonstrated that the solubility of the polymers in DMSO increased upon increasing the concentration of monomer 1.

Figure 2:
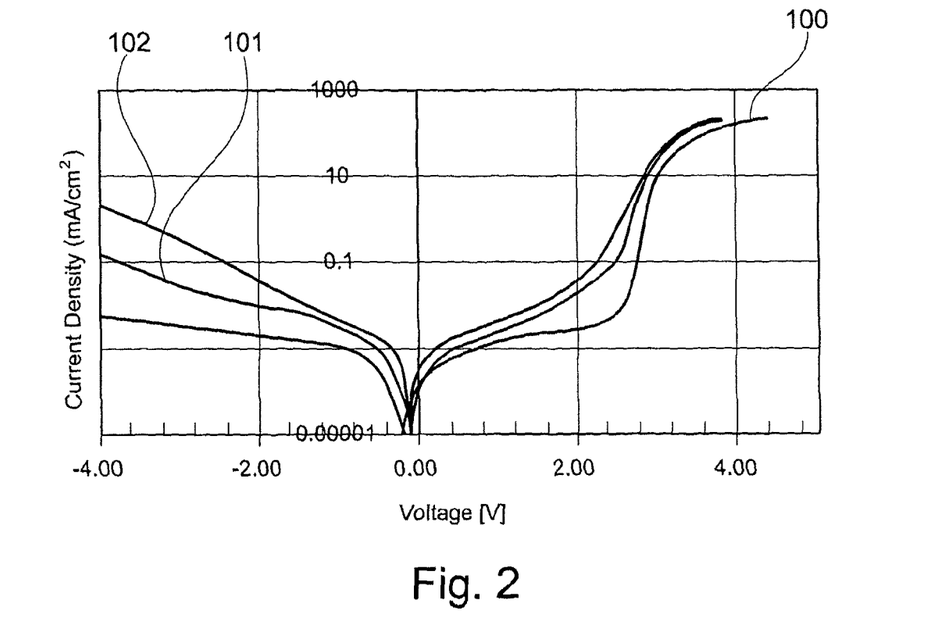
FIGS. 2 to 4 are graphs which show recorded device data for a range of polymers.

FIG. 2 shows a plot of drive voltage (V) as a function of current density (mA cm$^{-2}$) for polymers 100, 101, 102. As will be appreciated, the polymers 101, 102 show an improved (lower) drive voltage when compared to the voltage of polymer 100.

COMPARATIVE EXAMPLE 2

A semiconducting polymer 110 comprising 29.8% monomer 2b, 0.1% monomer 4 and 0.1% monomer 5, 20% monomer 6, 40% monomer 7 and 10% monomer 9 was prepared for use as a control.

EXAMPLE 3

A semiconducting polymer 111 according to a third embodiment of the invention was prepared, the polymer 111 comprising 15% monomer 1, 14.85% monomer 2b, 0.05% monomer 4, 0.1% monomer 5, 20% monomer 6 and 50% monomer 7.

Polymer 110 was not soluble in DMSO even when heated. Polymer 111 was readily soluble in DMSO upon heating. A further example polymer comprising 5% monomer 1 was partially soluble in DMSO upon heating. Thus, it was demonstrated that by increasing the polymer concentration of monomer 1 the solubility in DMSO increased.

Figure 3:
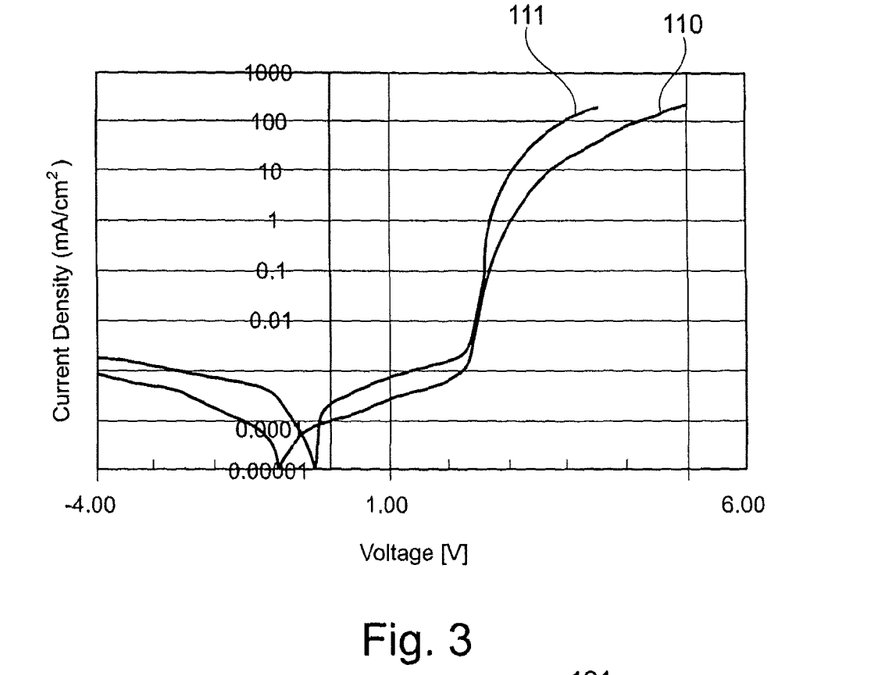

FIG. 3 shows a plot of drive voltage (V) as a function of current density (mA cm$^{-2}$) for polymers 110, 111. As may be seen, the polymer 111 shows an improved (lower) drive voltage as compared to the polymer 110.

COMPARATIVE EXAMPLE 3

A semiconducting polymer 120 comprising 20% monomer 2a, 19.9% monomer 2b, 0.05% monomer 4, 0.05% monomer 5, 30% monomer 6 and 30% monomer 8 was prepared for use as a control.

EXAMPLE 4

A semiconducting polymer 121 according to a fourth embodiment of the invention was prepared, the polymer 121 comprising 15% monomer 1, 20% monomer 2a, 4.9% monomer 2b, 0.05% monomer 4, 0.05% monomer 5, 30% monomer 6 and 30% monomer 7.

Polymer 121 was soluble in DMSO upon heating.

Figure 4:
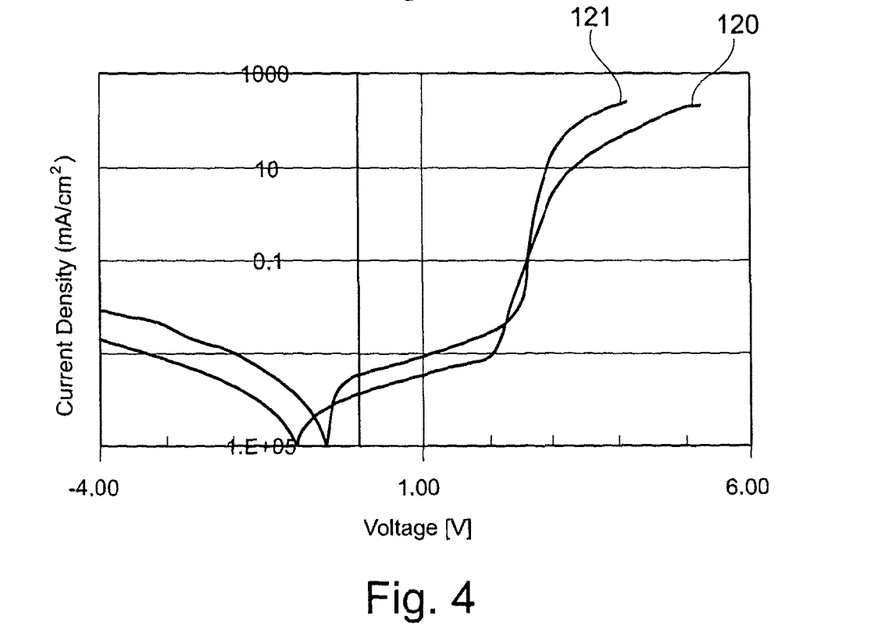

FIG. 4 shows a plot of drive voltage (V) as a function of current density (mA cm$^{-2}$) for polymers 120, 121. As may be seen, the polymer 121 shows an improved (lower) drive voltage as compared to the polymer 120.

EXAMPLE 5

A semiconducting polymer 130 was prepared for use as an electron injection layer (EIL), the polymer comprising 50% monomer 1 and 50% monomer 2b. Hole transporting polymer 140 was prepared comprising 50% monomer 9, 42.5% monomer 10, and 7.5% monomer 11.

Green electroluminescent polymer 150 was prepared comprising 20% monomer 9, 65% dihexylfluorene, and 15% triarylamine-dihexylfluorene monomer.

A light emitting device having the following structure was made:

ITO (45 nm)/HIL (35 nm)/polymer 140 (22 nm)/polymer 150 (60 nm)/polymer 130 (3 nm)/Al (200 nm)/Ag (100 nm). The hole injection layer (HIL) was obtained from Plextronics Inc. (PA).

COMPARATIVE EXAMPLE 6

For comparison a light emitting device lacking an EIL layer and having the following structure was made:

ITO (45 nm)/HIL (35 nm)/polymer 140 (22 nm)/polymer 150 (60 nm)/Al (200 nm)/Ag (100 nm).

COMPARATIVE EXAMPLE 7

For comparison a light emitting device with a low workfunction cathode and having the following structure was made:

ITO (45 nm)/HIL (35 nm)/polymer 140 (22 nm)/polymer 150 (60 nm)/NaF (2 nm)/Al (200 nm)/Ag (100 nm).

Figure 5:
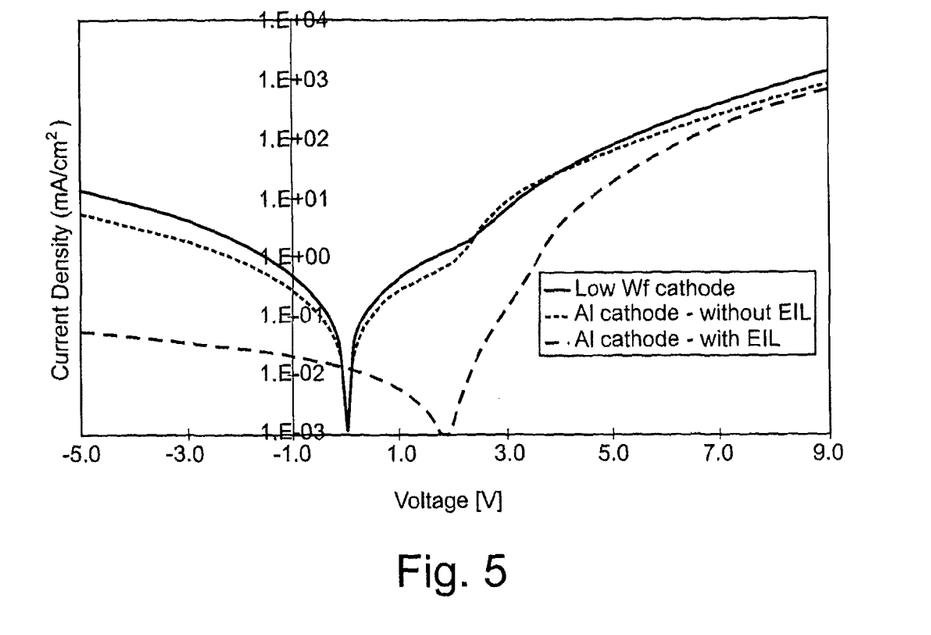
FIGS. 5 to 9 are graphs which show recorded device data for a device comprising an electron transport layer comprising a polymer.

FIG. 5 shows a plot of drive voltage (V) as a function of current density (mA cm$^{-2}$) for Examples 5-7.

Figure 6:
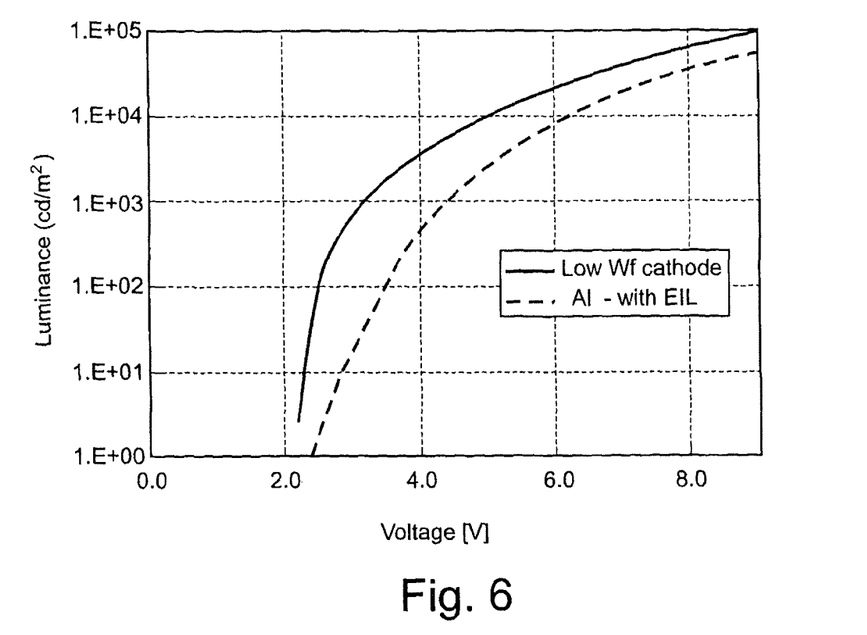

FIG. 6 shows a plot of luminance (cd/m$^2$) versus drive voltage for Examples 5 and 7. Example 6 did not emit light.

Figure 7:
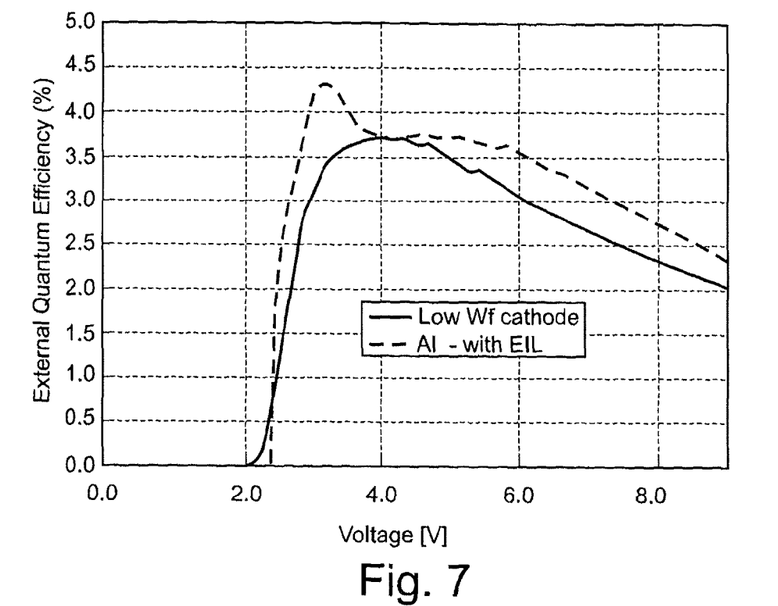

FIG. 7 shows a plot of external quantum efficiency (%) versus drive voltage for Examples 5 and 7. Example 6 did not emit light.

Figure 8:
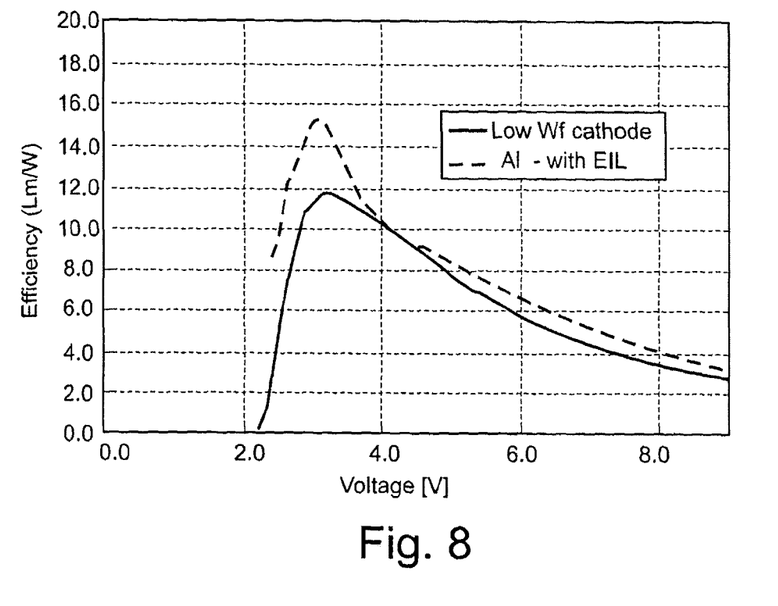

FIG. 8 shows a plot of efficiency (Lm/W) versus drive voltage for Examples 5 and 7. Example 6 did not emit light.

Figure 9:
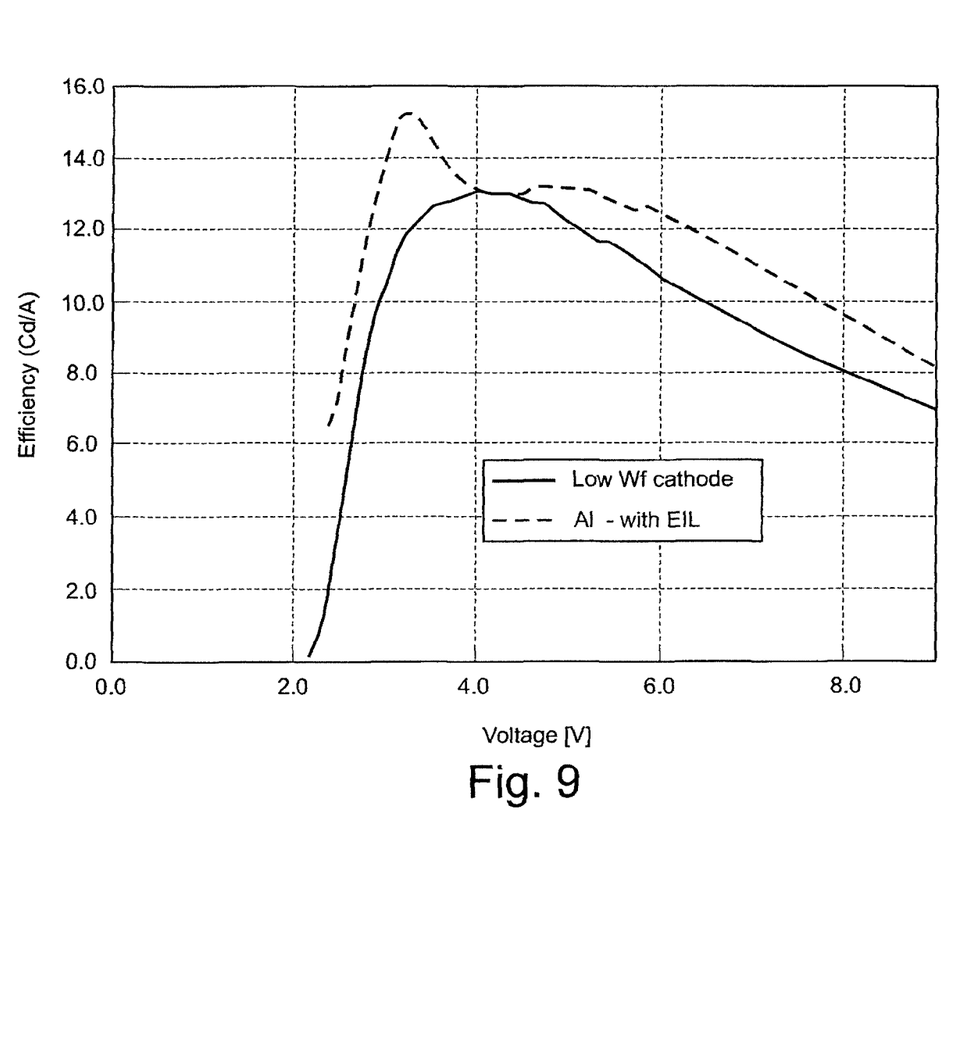

FIG. 9 shows a plot of efficiency (Cd/A) versus drive voltage for Examples 5 and 7. Example 6 did not emit light.

FIGS. 5-9 demonstrate the use of a polymer of the present invention as an electron injection layer in the absence of a low workfunction cathode.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A light emitting device comprising a light emitting layer comprising a semiconducting polymer having one or more repeat units, a first of the repeat units comprising the structure wherein $R^{12}$ to $R^{17}$ independently comprise H or a polyether group having five to fifteen ethoxy repeat units, wherein at least one of $R^{12}$ to $R^{17}$ comprises the polyether group.

2. A light emitting device according to claim 1, wherein the first repeat unit comprises at least 0.01% of the repeat units of the polymer.

3. A light emitting device according to claim 2, wherein the first repeat unit comprises at least 5% of the repeat units of the polymer.

4. A light emitting device according to claim 1, wherein the polyether groups comprise substituted polyethylene glycol groups.

5. A light emitting device according to claim 4, wherein the polyether groups are substituted by $C_1$ to $C_5$ straight, branched, or cyclic alkyl, alkenyl, or alkynyl carbon chains.

6. A light emitting device according to claim 1, wherein the polymer comprises fluorene repeat units.

7. A light emitting device according to claim 1, wherein $R^{12}$, $R^{14}$, $R^{15}$ and $R^{17}$ consist of H and at least one of $R^{13}$ and $R^{16}$ comprise the polyether group.

8. A light emitting device according to claim 1, wherein $R^{13}$ and $R^{16}$ consist of H and at least one of $R^{12}$, $R^{14}$, $R^{15}$, and $R^{17}$ comprise the polyether group.

9. A light emitting device according to claim 1, wherein $R^{14}$ and $R^{15}$ consist of H and at least one of $R^{12}$, $R^{13}$, $R^{16}$ and $R^{17}$ comprise the polyether group.

10. A light emitting device according to claim 1, wherein at least four of $R^{12}$ to $R^{17}$ comprise the polyether group.

11. A light emitting device according to claim 1, wherein the polyether group is terminated by a terminating group selected from optionally substituted straight, branched, or cyclic $C_1$ to $C_{10}$ alkyl, alkenyl, or alkynyl carbon chains.

12. A light emitting device according to claim 11, wherein the polyether group is terminated by a terminating group comprising a methyl group or an ethyl group.

13. A light emitting device according to claim 1, wherein the polyether group is joined to the repeat units by means of a linker group.

14. A light emitting device according to claim 13, wherein the linker group comprises optionally substituted straight, branched, or cyclic $C_1$ to $C_{10}$ alkyl, alkenyl, or alkynyl chains.

15. A light emitting device according to claim 13, wherein the linker group comprises optionally substituted straight, branched, or cyclic $C_1$ to $C_5$ alkyl, alkenyl, or alkynyl chains.

16. A light emitting device according to claim 13, wherein the linker groups comprise methyl, ethyl, or propyl groups.

17. A light emitting device according to claim 1, further comprising repeat units comprising hole transport moieties wherein some or all of the hole transport moieties are substituted with a polyether group.

18. A light emitting device according to claim 1, wherein the light emitting layer comprises a composition comprising the semiconducting polymer and a polyether compound.

19. A light emitting device according to claim 1, wherein the light emitting layer further comprises a polyether compound.

20. A light emitting device according to claim 1, further comprising at least one of a hole transport layer and an electron transport layer adjacent the light emitting layer, wherein the hole transport layer and/or the electron transport layer does not comprise a polyether substituted material.

21. A light emitting device according to claim 1, wherein the light emitting layer further comprises a phosphorescent host.

22. A composition comprising:
a semiconducting polymer having one or more repeat units, a first of the repeat units comprising the structure:

wherein $R^{12}$ to $R^{17}$ independently comprise H or a polyether group having five to fifteen ethoxy repeat units, wherein at least one of $R^{12}$ to $R^{17}$ comprises the polyether group, and
one or more phosphorescent hosts.

23. A method for manufacturing an electronic device comprising forming a light emitting device comprising a light emitting layer comprising a semiconducting polymer having one or more repeat units, a first of the repeat units comprising the structure wherein $R^{12}$ to $R^{17}$ independently comprise H or a polyether group having five to fifteen ethoxy repeat units, wherein at least one of $R^{12}$ to $R^{17}$ comprises the polyether group, comprising applying a solution comprising the semiconducting polymer to a substrate.

24. A method according to claim 23, wherein the solution is applied by a solution processing technique.

* * * * *